United States Patent
Ishiguro et al.

(10) Patent No.: US 10,396,164 B2
(45) Date of Patent: Aug. 27, 2019

(54) SEMICONDUCTOR CRYSTAL SUBSTRATE WITH FE DOPING

(71) Applicant: FUJITSU LIMITED, Kawasaki-shi, Kanagawa (JP)

(72) Inventors: Tetsuro Ishiguro, Kawasaki (JP); Atsushi Yamada, Hiratsuka (JP); Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/687,814

(22) Filed: Aug. 28, 2017

(65) Prior Publication Data

US 2018/0069086 A1 Mar. 8, 2018

(30) Foreign Application Priority Data

Sep. 6, 2016 (JP) ................... 2016-173415

(51) Int. Cl.
| | |
|---|---|
| *H01L 29/207* | (2006.01) |
| *H01L 29/20* | (2006.01) |
| *H01L 29/66* | (2006.01) |
| *H01L 29/778* | (2006.01) |

(52) U.S. Cl.
CPC ........ *H01L 29/207* (2013.01); *H01L 29/2003* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 7,884,393 | B2* | 2/2011 | Hashimoto | ....... H01L 21/02389 257/192 |
| 9,608,075 | B1* | 3/2017 | Wan | ..................... H01L 29/207 |
| 9,831,310 | B2* | 11/2017 | Kotani | ................ H01L 29/2003 |
| 2012/0025203 | A1* | 2/2012 | Nakata | ................ H01L 29/2003 257/76 |
| 2014/0239308 | A1* | 8/2014 | Hallin | ............... H01L 21/02458 257/76 |
| 2015/0357419 | A1* | 12/2015 | Lutgen | ................ H01L 21/0254 257/22 |
| 2017/0117404 | A1* | 4/2017 | Era | ..................... H01L 29/7786 |

FOREIGN PATENT DOCUMENTS

| | | |
|---|---|---|
| JP | 2013-211363 | 10/2013 |
| JP | 2014-136658 | 7/2014 |
| JP | 2014-209638 | 11/2014 |

* cited by examiner

*Primary Examiner* — Lex H Malsawma
(74) *Attorney, Agent, or Firm* — Fujitsu Patent Center

(57) ABSTRACT

A semiconductor crystal substrate includes a first buffer layer formed of a nitride semiconductor over a substrate, a second buffer layer formed of a nitride semiconductor on the first buffer layer, a first semiconductor layer formed of a nitride semiconductor on or over the second buffer layer, and a second semiconductor layer formed of a nitride semiconductor on the first semiconductor layer. The Fe concentration of the first buffer layer is higher than the C concentration of the first buffer layer. The C concentration of the second buffer layer is higher than the Fe concentration of the second buffer layer.

19 Claims, 15 Drawing Sheets

SEMICONDUCTOR CRYSTAL SUBSTRATE WITH FE DOPING

CROSS-REFERENCE TO RELATED APPLICATION

This application is based upon and claims the benefit of priority of the prior Japanese Patent Application No. 2016-173415, filed on Sep. 6, 2016, the entire contents of which are incorporated herein by reference.

FIELD

A certain aspect of the embodiments discussed herein is related to semiconductor crystal substrates, semiconductor devices, methods of manufacturing a semiconductor crystal substrate, and methods of manufacturing a semiconductor device.

BACKGROUND

Nitride semiconductors have features such as a high saturation electron velocity and a wide band gap, and their application to high-withstand-voltage, high-power transistors has been studied. For example, gallium nitride (GaN), which is a nitride semiconductor, has a band gap of 3.4 eV, which is greater than the band gap of Si (1.1 eV) and the band gap of gallium arsenide (GaAs) (1.4 eV), and has a high breakdown field strength. Therefore, nitride semiconductors such as GaN are extremely promising as materials for semiconductor devices for power supply that operate at high voltage and output high power. With respect to semiconductor devices using a nitride semiconductor, many reports have been made on field-effect transistors, particularly high-electron-mobility transistors (HEMTs).

Specifically, HEMTs using a nitride semiconductor have a structure where an aluminum gallium nitride/gallium nitride (AlGaN/GaN) heterointerface or an indium aluminum nitride/gallium nitride (InAlN/GaN) heterointerface is formed on a substrate. As a result, a high density two-dimensional electron gas (2DEG) is generated near the heterointerface. Therefore, this 2DEG can be used as a channel carrier. GaN, which is a wide gap semiconductor having a high saturation electron velocity and a high dielectric breakdown voltage, can form a high-power high-frequency device of high efficiency, and is used for, for example, high-power, high-frequency amplifiers. A nitride semiconductor layer is epitaxially grown by metalorganic vapor phase epitaxy (MOVPE).

According to HEMTs using a nitride semiconductor, an off-state leakage current may flow between a source electrode and a drain electrode through a buffer layer when a pinch-off occurs. Therefore, according to some nitride-semiconductor HEMTs, the buffer layer is doped with carbon (C) or iron (Fe).

Specifically, in the case of forming GaN by MOVPE, the capturing of donor impurities such as oxygen or donor-type defects such as nitrogen vacancies are likely to occur. Therefore, GaN is likely to present n-type conduction characteristics without being intentionally doped with impurities. Accordingly, even when an off voltage is applied to the gate, it is possible that a depletion layer does not sufficiently extend to allow a leakage current to flow via a buffer layer. Therefore, there is the technique of suppressing the off-state leakage current by increasing the resistance of the buffer layer by doping the buffer layer with Fe, which is an acceptor impurity, to compensate the donor. In particular, because Fe forms a deeper acceptor level than C in GaN, a higher effect can be expected.

Fe, however, is likely to diffuse upward in a GaN layer during its growth. Fe is greater in ion radius than Ga. Therefore, the Ga site, where Fe is to be substitutionally placed, is not easily entered by Fe, and it is believed that Fe that is not accommodated in a predetermined position moves upward to cause the above-described upward diffusion. If Fe diffuses to a region where a 2DEG is generated, the diffused Fe serves as a scattering source for electrons to reduce the electron mobility, thus causing, for example, an increase in the on-resistance.

To prevent such Fe diffusion, a structure where an AlGaN layer is formed on an Fe-doped buffer layer and an i-GaN layer serving as a channel layer is formed on the AlGaN layer is proposed. According to this structure, because the a lattice constant of AlGaN is smaller than the a lattice constant of GaN, it is possible to prevent entry of Fe that is greater in size than Ga and thus to prevent the upward diffusion of Fe.

Reference may be made to, for example, Japanese Laid-open Patent Publication Nos. 2013-211363, 2014-136658, and 2014-209638 for related art.

SUMMARY

According to an aspect of the embodiments, a semiconductor crystal substrate includes a first buffer layer formed of a nitride semiconductor over a substrate, a second buffer layer formed of a nitride semiconductor on the first buffer layer, a first semiconductor layer formed of a nitride semiconductor on or over the second buffer layer, and a second semiconductor layer formed of a nitride semiconductor on the first semiconductor layer. The Fe concentration of the first buffer layer is higher than the C concentration of the first buffer layer. The C concentration of the second buffer layer is higher than the Fe concentration of the second buffer layer.

The object and advantages of the embodiments will be realized and attained by means of the elements and combinations particularly pointed out in the claims.

It is to be understood that both the foregoing general description and the following detailed description are exemplary and explanatory and not restrictive of the invention.

DESCRIPTION OF EMBODIMENTS

Figure 1:
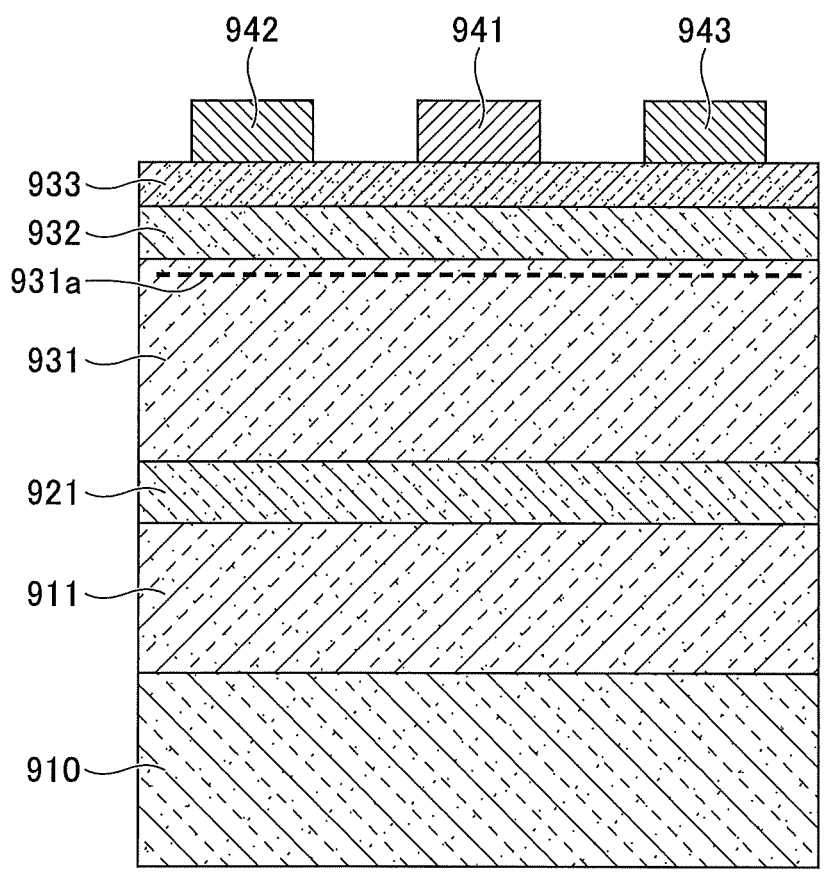
FIG. 1 is a structure diagram of a semiconductor device including an Fe-doped buffer layer.

As described above, to prevent Fe diffusion, there is proposed a structure where an AlGaN layer is formed on an Fe-doped buffer layer and an i-GaN layer serving as a channel layer is formed on the AlGaN layer. According to this structure, the i-GaN layer formed on the AlGaN layer is formed by hetero growth. Therefore, a dislocation starting at the heterointerface penetrates through to the top, thus degrading the crystallinity of the channel layer. Accordingly, although suppressing Fe diffusion, the formation of an AlGaN layer on an Fe-doped buffer layer degrades the crystallinity of the channel layer to reduce the electron mobility to increase the on-resistance, thus not making much improvement in the HEMT characteristics.

Accordingly, there is a demand for a semiconductor crystal substrate for forming a HEMT of a nitride semiconductor that is reduced in on-resistance while keeping good crystallinity of a channel layer.

A semiconductor crystal substrate according to an embodiment of the present invention makes it possible to manufacture a HEMT formed of a nitride semiconductor that is reduced in on-resistance with good crystallinity of a channel layer.

Preferred embodiments of the present invention will be explained with reference to accompanying drawings. In the following description, the same elements or members are referred to using the same reference numeral, and a duplicate description thereof will be omitted.

[a] First Embodiment

First, a description is given in more detail of a semiconductor device in which an Fe-doped buffer layer is formed. FIG. 1 is a structure diagram of a semiconductor device in which an Fe-doped buffer layer is formed. According to this semiconductor device, which is a HEMT, nitride semiconductor layers such as a nucleation layer 911, a buffer layer 921, a channel layer 931, a barrier layer 932, and a cap layer 933 are formed on a substrate 910 by MOVPE as illustrated in FIG. 1. As a result, in the channel layer 931, a 2DEG 931a is generated near the interface between the channel layer 931 and the barrier layer 932. A gate electrode 941, a source electrode 942, and a drain electrode 943 are formed on the cap layer 933. As the substrate 910, for example, a silicon carbide (SiC) substrate or a sapphire (Al$_2$O$_3$) substrate is used. The nucleation layer 911 is formed of, for example, GaN, AlGaN, or AlN. The buffer layer 921 is formed of Fe-doped GaN. The channel layer 931 is formed of i-GaN. The barrier layer 932 is formed of AlGaN. The cap layer 933 is formed of GaN.

According to this HEMT, the buffer layer 921 is doped with Fe to increase resistance. When forming the channel layer 931, the Fe dopant of the buffer layer 921 may diffuse upward to a region where the 2DEG 931a is formed. When Fe thus diffuses up to a region where the 2DEG 931a is formed, electrons in the 2DEG 931a are scattered by Fe to reduce mobility. Therefore, the HEMT characteristics are degraded.

Figure 2:
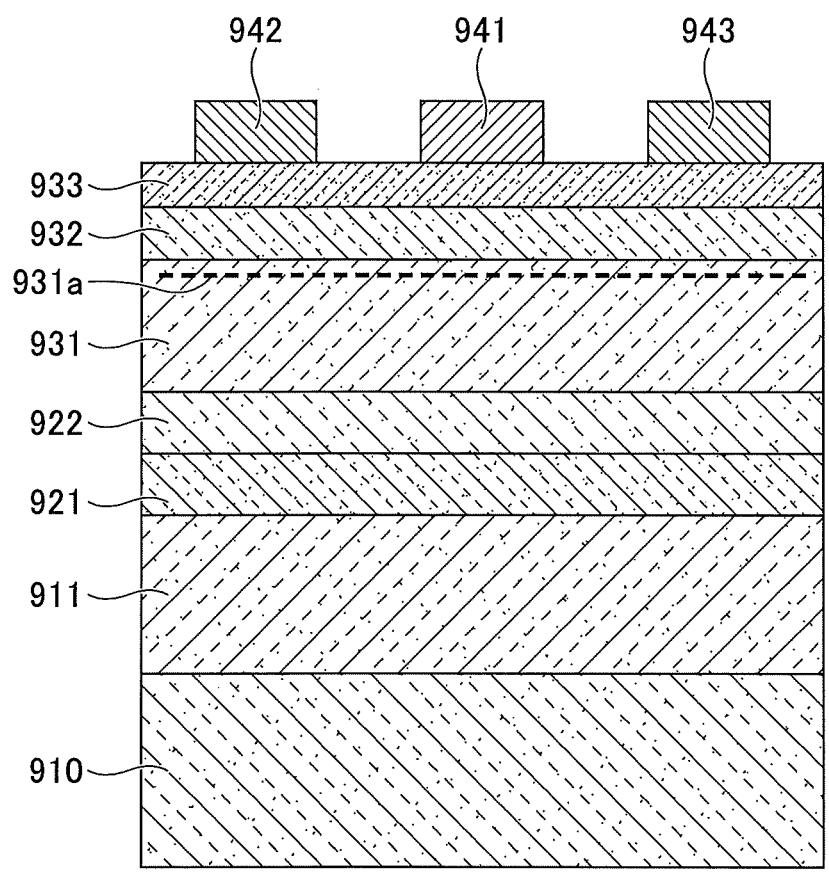
FIG. 2 is a structure diagram of a semiconductor device including an Fe-doped buffer layer.

Therefore, as illustrated in FIG. 2, Fe diffusion can be suppressed by forming a diffusion preventing layer 922 of AlGaN between the buffer layer 921 and the channel layer 931. The channel layer 931, however, is formed of i-GaN, which is different in lattice constant from AlGaN forming the diffusion preventing layer 922. Accordingly, a dislocation is likely to occur in the channel layer 931 to degrade the crystallinity of the channel layer 931. As a result, the electron mobility is decreased to increase the on-resistance, thus not making much improvement in the HEMT characteristics.

Therefore, as a result of earnestly studying how to suppress Fe diffusion without forming an AlGaN layer, the inventors have found a method of suppressing Fe diffusion without forming an AlGaN layer. Semiconductor devices according to embodiments of the present invention are based on the result thus obtained by the earnest study by the inventors.

[Semiconductor Device]

Figure 3:
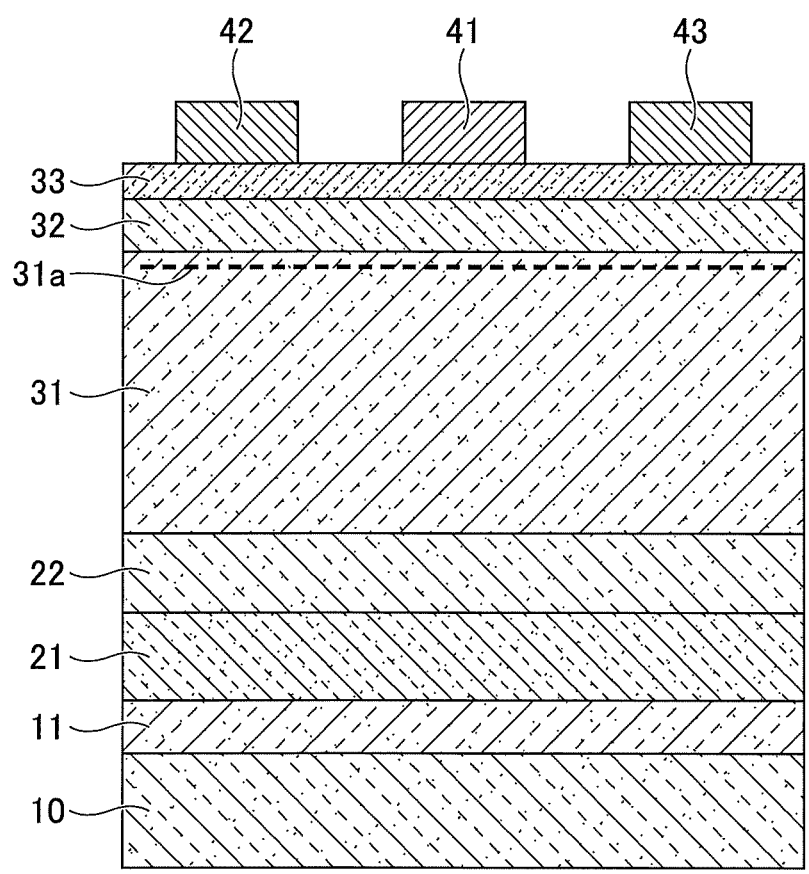
FIG. 3 is a structure diagram of a semiconductor device according to a first embodiment.

Next, a semiconductor device and a semiconductor crystal substrate according to a first embodiment are described with reference to FIG. 3. The semiconductor device according to this embodiment includes a substrate 10 and nitride semiconductor layers such as a nucleation layer 11, a first buffer layer 21, a second buffer layer 22, a channel layer 31, a barrier layer 32, and a cap layer 33 formed on the substrate 10 by MOVPE. As a result, in the channel layer 31, a 2DEG 31a is generated near the interface between the channel layer 31 and the barrier layer 32. Furthermore, a gate electrode 41, a source electrode 42, and a drain electrode 43 are formed on the cap layer 33. In the following, the channel layer 31 may be referred to as "first semiconductor layer", and the barrier layer 32 may be referred to as "second semiconductor layer." Furthermore, the semiconductor crystal substrate according to this embodiment includes the substrate 10 and nitride semiconductor layers such as the nucleation layer 11, the first buffer layer 21, the second buffer layer 22, the channel layer 31, the barrier layer 32, and the cap layer 33 formed on the substrate 10 by MOVPE.

For the substrate 10, for example, silicon carbide (SiC), sapphire (Al$_2$O$_3$), silicon (Si), GaN, or zinc oxide (ZnO) may be used. The nucleation layer 11, which is partly or entirely formed of a nucleation layer, is formed of GaN, AlN or AlGaN, and has a film thickness of approximately 20 nm.

The first buffer layer 21 is formed of GaN doped with Fe, and has a film thickness of approximately 300 nm. In the first buffer layer 21, the peak concentration of the Fe dopant is more than or equal to $1\times10^{16}$ atoms/cm$^3$ and less than or equal to $1\times10^{18}$ atoms/cm$^3$, for example, $5\times10^{17}$ atoms/cm$^3$, and the Fe-dopant concentration is more than or equal to $1\times10^{17}$ atoms/cm$^3$ over the entire first buffer layer 21. Therefore, the first buffer layer 21 is a p-type. The second buffer layer 22 is formed of GaN not doped with Fe, and has a film thickness of approximately 200 nm.

The channel layer 31 is formed of i-GaN having a film thickness of approximately 200 nm. The barrier layer 32 is formed of AlGaN having a film thickness of approximately 20 nm. The cap layer 33 is formed of GaN having a film thickness of approximately 5 nm. The Al composition of the barrier layer 32 is preferably 50% or less to prevent excessive degradation of crystallinity due to lattice mismatch. The barrier layer 32 may alternatively be formed of InAlN.

Figure 4:
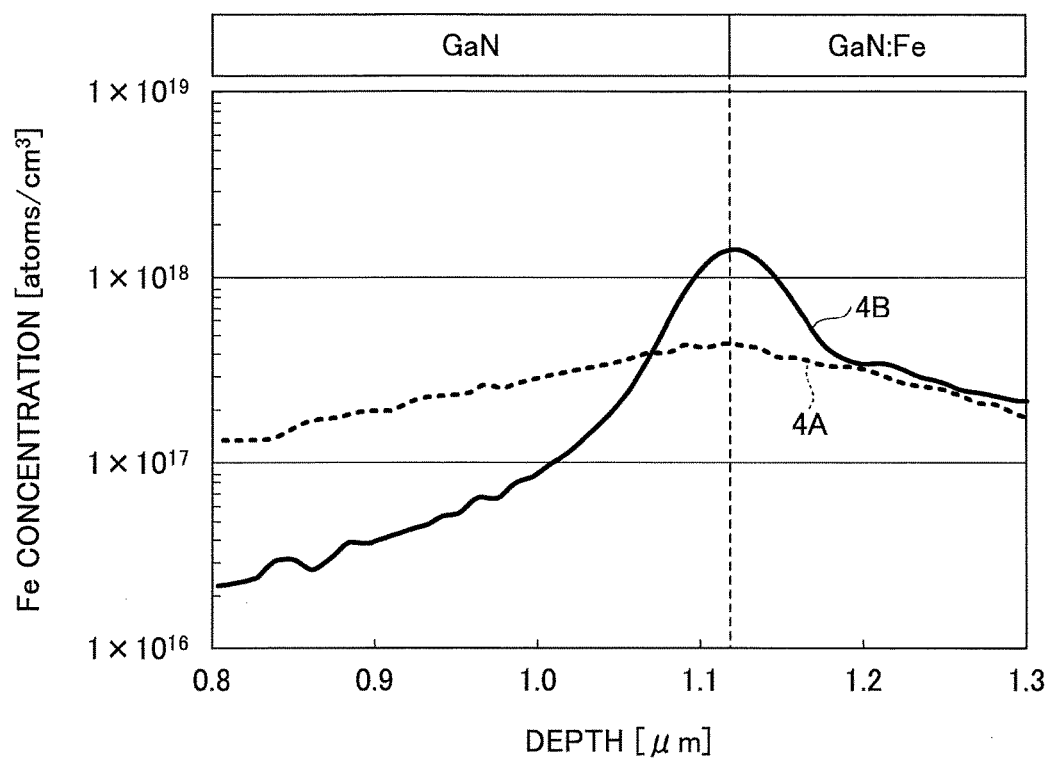
FIG. 4 is a distribution chart of Fe concentration in a film thickness direction.

Next, a concentration distribution of Fe in the first buffer layer 21 and the second buffer layer 22 is described with reference to FIG. 4. FIG. 4 is a graph representing the results of a SIMS (secondary ion mass spectrometry) analysis of samples in which GaN not doped with Fe is formed after formation of Fe-doped GaN. In FIG. 4, Fe-doped GaN and GaN not doped with Fe are indicated on the right side and the left side, respectively, of the vertical dashed line. Sample 4A is a sample in which Fe-doped GaN is formed at a growth temperature of 1200° C. and GaN not doped with Fe is thereafter formed at the same growth temperature of 1200° C. The measurement result of the Fe concentration distribution of Sample 4A is indicated by the thick dashed line 4A. In Sample 4A, because Fe diffuses in GaN not doped with Fe, the Fe concentration is more than or equal to $1 \times 10^{17}$ atoms/cm$^3$ over the entire GaN not doped with Fe. In contrast, Sample 4B is a sample in which Fe-doped GaN is formed at a growth temperature of 1200° C. and GaN not doped with Fe is thereafter formed at a growth temperature of 900° C. The measurement result of the Fe concentration distribution of Sample 4B is indicated by the thick bold line 4B. In Sample 4B, because the diffusion of Fe is suppressed in GaN not doped with Fe, the Fe concentration decreases sharply as the film deposition progresses. As a result, the Fe concentration is less than or equal to $1 \times 10^{17}$ atoms/cm$^3$ where GaN not doped with Fe is deposited for 100 nm or more. In Sample 4B, the Fe concentration is high at the interface between Fe-doped GaN and GaN not doped with Fe with Fe concentrating at the interface.

Thus, according to this embodiment, the diffusion of Fe in the second buffer layer 22 can be suppressed by forming the first buffer layer 21 at a growth temperature of 1200° C. and forming the second buffer layer 22 at a growth temperature of 900° C. From the above-described results, it is believed that the diffusion of Fe can be suppressed by lowering a growth temperature. Therefore, it is inferred that the diffusion of Fe can be suppressed to a greater or lesser degree by causing the growth temperature of the second buffer layer 22 to be lower than the growth temperature of the first buffer layer 21. Furthermore, in the case of depositing a GaN film by MOVPE, the deposited GaN film contains carbon (C). Specifically, in the case where a GaN film is deposited at a growth temperature of 1200° C., the C concentration is approximately $1 \times 10^{16}$ atoms/cm$^3$, and in the case where a GaN film is deposited at a growth temperature of 900° C., the C concentration is approximately $1 \times 10^{19}$ atoms/cm$^3$.

Figure 5:
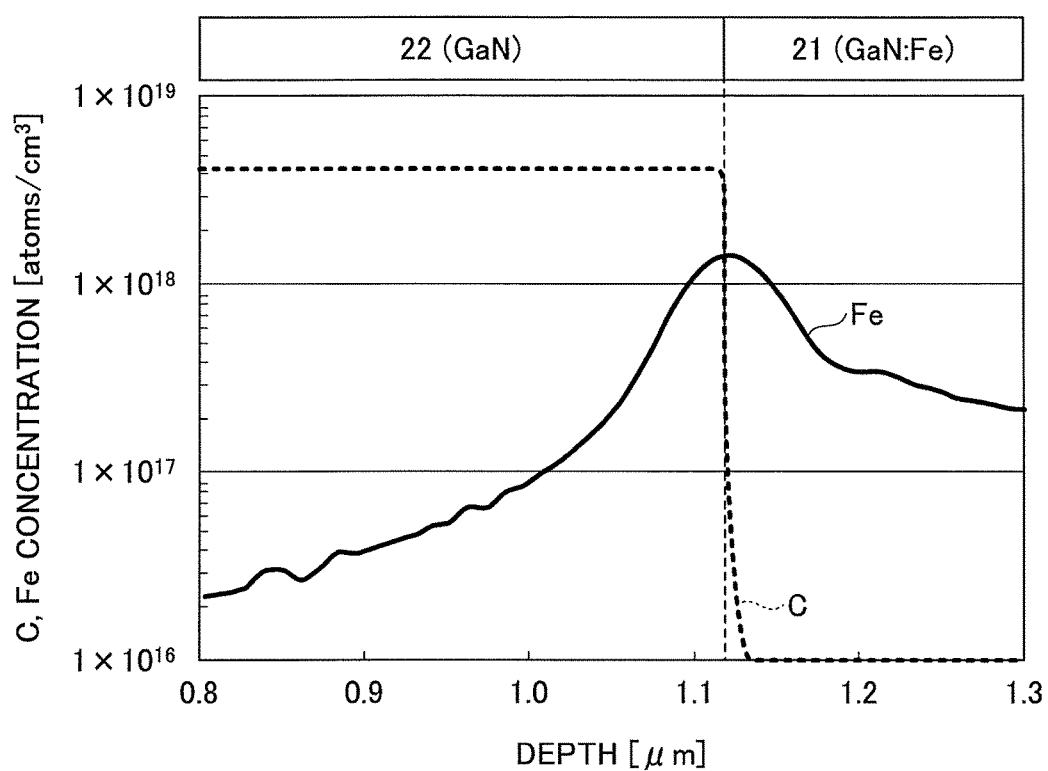
FIG. 5 is a distribution chart of Fe concentration and C concentration in the film thickness direction.

Thus, according to the semiconductor device of this embodiment, the Fe concentration is higher than the C concentration in the first buffer layer 21, and the F concentration is lower than the C concentration in the second buffer layer 22. FIG. 5 presents the relationship between the Fe concentration and the C concentration in the first buffer layer 21 and the second buffer layer 22 in Sample 4B, indicating the Fe concentration by the thick solid line and the C concentration by the thick dashed line.

According to this embodiment, the C concentration of the second buffer layer 22 is higher than the C concentration of the first buffer layer 21. The C concentration of the first buffer layer 21 is preferably less than $1 \times 10^{17}$ atoms/cm$^3$. The C concentration of the second buffer layer 22 is preferably more than or equal to $1 \times 10^{17}$ atoms/cm$^3$, more preferably, more than or equal to $1 \times 10^{18}$ atoms/cm$^3$, and still more preferably, more than or equal to $1 \times 10^{19}$ atoms/cm$^3$.

Figure 6:
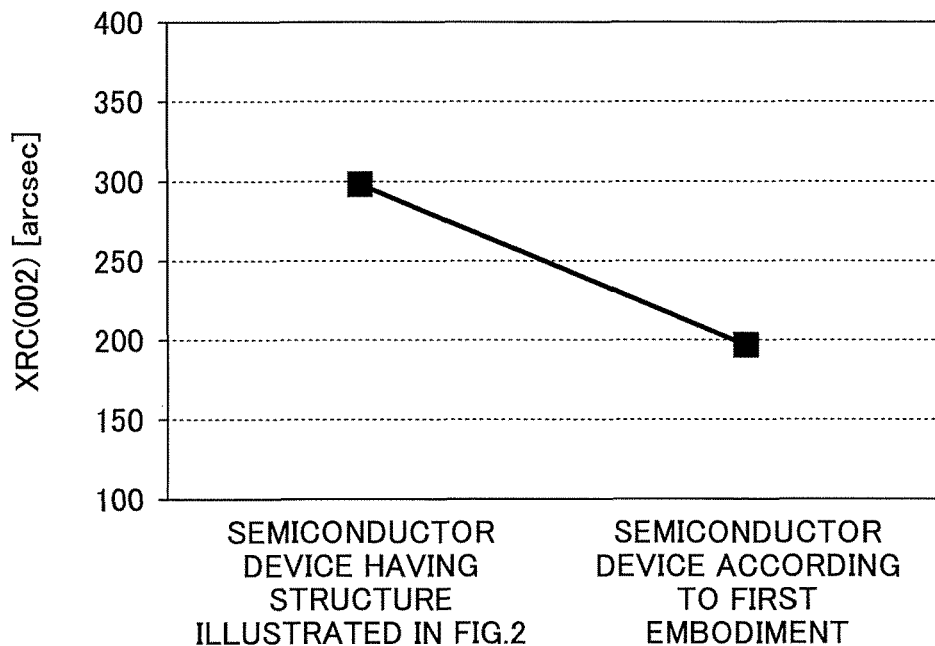
FIG. 6 is a graph illustrating the results of an XRC(002) measurement of a channel layer.

Next, the crystallinity of the channel layer of a semiconductor device is described. FIG. 6 is a graph representing the result of an x-ray rocking curve (XRC) measurement of the channel layer of each of the semiconductor device according to this embodiment and a semiconductor device having a structure as illustrated in FIG. 2. In FIG. 6, XRC(002) indicates the half width of a peak, and a smaller XRC(002) value means better crystallinity of the channel layer. Referring to FIG. 6, the XRC(002) value of the semiconductor device having a structure as illustrated in FIG. 2 is approximately 300 arcsec, while the XRC(002) value of the semiconductor device according to this embodiment is approximately 200 arcsec. Accordingly, the semiconductor device according to this embodiment has a smaller XRC(002) value and accordingly is better in the crystallinity of the channel layer than the semiconductor device having a structure as illustrated in FIG. 2.

Figure 7:
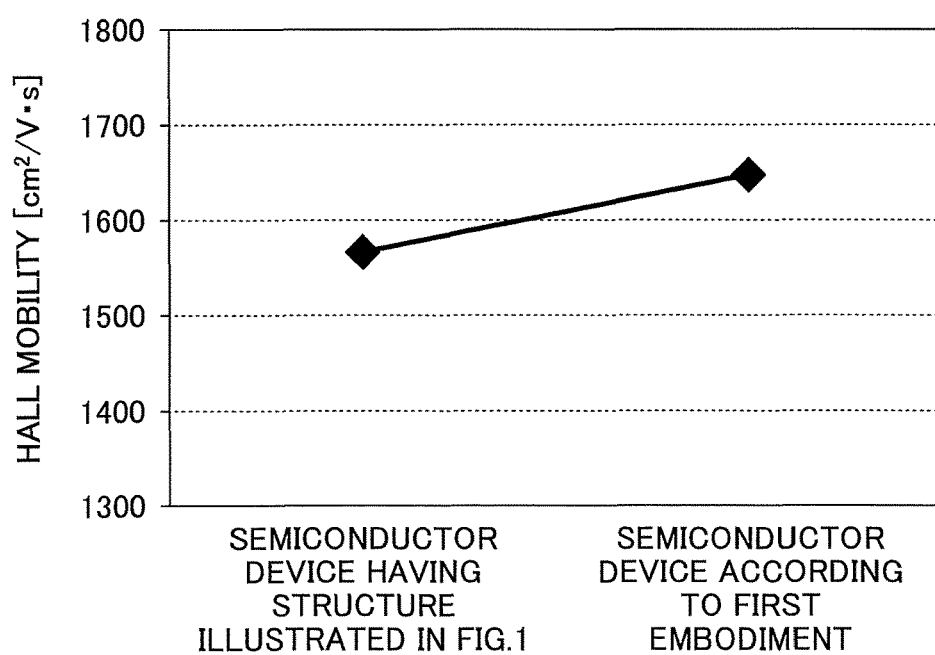
FIG. 7 is a graph illustrating the electron mobility of the channel layer according to a Hall effect measurement.

Next, the electron mobility of the channel layer of a semiconductor device is described. FIG. 7 is a graph representing the result of a Hall effect measurement of the electron mobility, namely, the 2DEG mobility, of the channel layer of each of the semiconductor device according to this embodiment and a semiconductor device having a structure as illustrated in FIG. 1. Referring to FIG. 7, the electron mobility of the semiconductor device having a structure as illustrated in FIG. 1 is approximately 1560 cm$^2$/V·s, while the electron mobility of the semiconductor device according to this embodiment is approximately 1650 cm$^2$/V·s. Thus, the semiconductor device according to this embodiment is higher in electron mobility than the semiconductor device having a structure as illustrated in FIG. 1.

Thus, according to the semiconductor device of this embodiment, it is possible to suppress the diffusion of Fe into a channel layer while keeping good crystallinity of the channel layer.

[Method of Manufacturing Semiconductor Device]

Next, a method of manufacturing a semiconductor device according to this embodiment is described with reference to FIGS. 8A through 10. According to this embodiment, nitride semiconductor layers are formed by crystal growth by MOVPE. In forming nitride semiconductor layers, trimethylgallium (TMGa) is used as a raw material of Ga, trimethylaluminum (TMAl) is used as a raw material of Al, and ammonia (NH$_3$) is used as a raw material of nitrogen (N). Furthermore, ferrocene (Cp$_2$Fe) is used as a raw material of Fe. All source gases are subjected to flow rate control by a mass flow controller (MFC), and are fed into the reactor of an MOVPE apparatus together with a carrier gas.

Figure 8A:
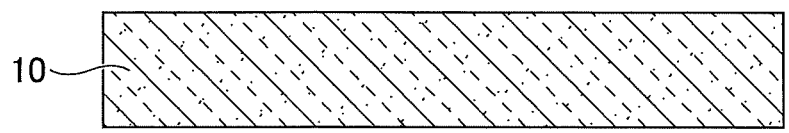
FIGS. 8A through 8F are diagrams illustrating steps of a method of manufacturing a semiconductor device according to the first embodiment.

First, as illustrated in FIG. 8A, the substrate 10 is subjected to heat treatment (thermal cleaning) for a few minutes in a H$_2$ atmosphere. For example, silicon carbide (SiC), sapphire (Al$_2$O$_3$), silicon (Si), GaN or zinc oxide (ZnO) may be used for the substrate 10.

Figure 8B:
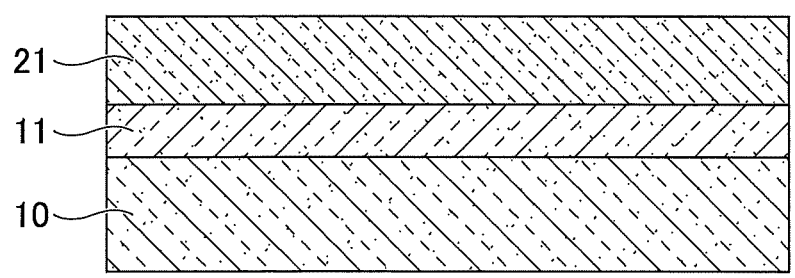

Next, as illustrated in FIG. 8B, the nucleation layer 11 and the first buffer layer 21 are formed on the substrate 10. Specifically, the nucleation layer 11 and the first buffer layer 21 are epitaxially grown in this order at a growth temperature of 1200° C. on the substrate 10. The nucleation layer 11 is formed by depositing a GaN, AlN or AlGaN film, and has a film thickness of 20 nm. The first buffer layer 21 is formed by depositing a GaN film doped with Fe as an impurity element, and has a film thickness of approximately 300 nm.

Figure 8C:
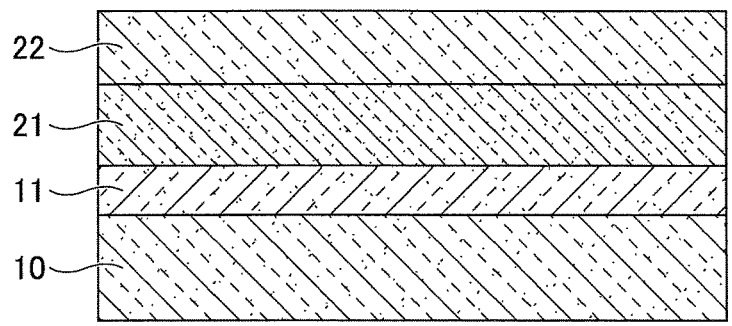
Figure 9:
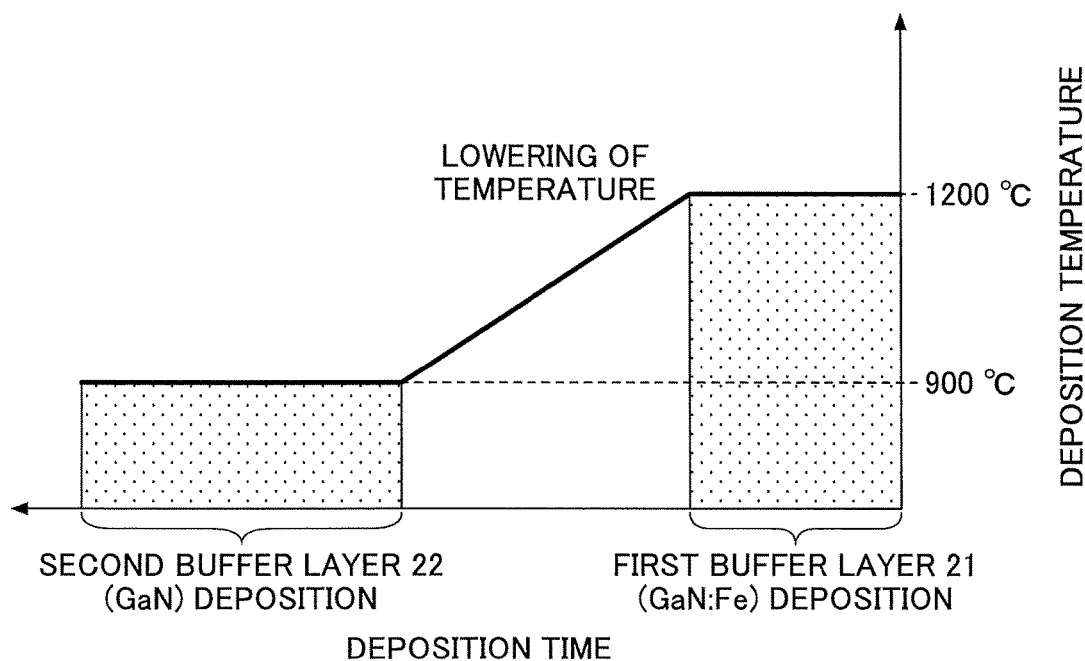
FIG. 9 is a diagram illustrating the method of manufacturing a semiconductor device according to the first embodiment.
Figure 10:
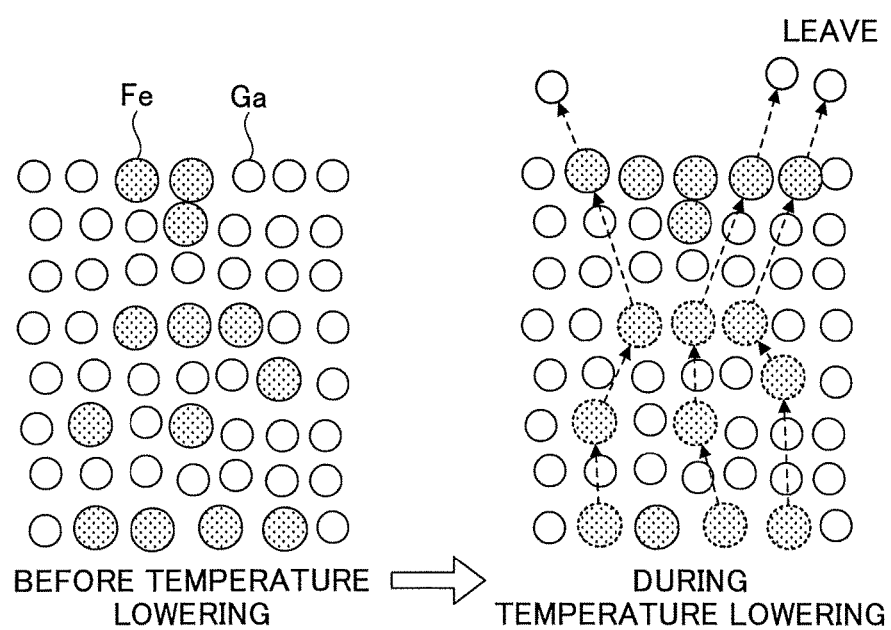
FIG. 10 is a diagram illustrating the method of manufacturing a semiconductor device according to the first embodiment.

Next, as illustrated in FIG. 8C, the second buffer layer 22 is formed on the first buffer layer 21. Specifically, the heating of the substrate 10 is stopped to lower the temperature of the substrate 10, and a GaN film having a thickness of 200 nm is deposited at a growth temperature of 900° C. to form the second buffer layer 22. To be more specific, as illustrated in FIG. 9, after depositing the first buffer layer 21, the supply of raw materials is stopped, and the heating of the substrate 10 is stopped to lower the temperature of the substrate 10 to 900° C. When the temperature of the substrate 10 becomes 900° C., raw materials are supplied to start the deposition of the second buffer layer 22. As illustrated in FIG. 10, while the supply of raw materials is stopped and the temperature of the substrate 10 is lowered, Ga atoms leave the surface of the first buffer layer 21 during the lowering of the temperature, and therefore, Fe atoms present inside GaN before the lowering of the temperature move toward the surface to fill in vacancies. As a result, many Fe atoms are exposed at the surface of the first buffer layer 21. Thereafter, because Fe atoms are less likely to diffuse upward in the second buffer layer 22 deposited at a growth temperature of 900° C., Fe concentrates at the interface between the first buffer layer 21 and the second buffer layer 22 as illustrated in FIGS. 4 and 5. In the case where the second buffer layer 22 is formed at 900° C., the C concentration of the second buffer layer 22 is approximately $1 \times 10^{19}$ atoms/cm$^3$.

Figure 8D:
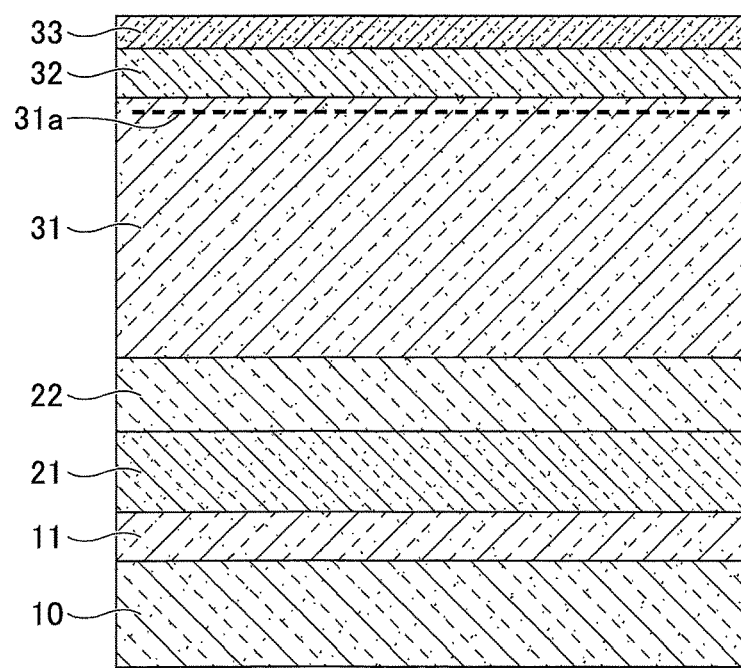

Next, as illustrated in FIG. 8D, the channel layer 31, the barrier layer 32, the cap layer 33 are formed in order on the second buffer layer 22. Specifically, after the formation of the second buffer layer 22, the supply of raw materials is stopped, and the substrate 10 is heated again to 1200° C. When the temperature of the substrate 10 becomes 1200° C., raw materials are supplied to form the channel layer 31, the barrier layer 32, and the cap layer 33. The channel layer 31 is formed by depositing an i-GaN film having a thickness of 200 nm. The barrier layer 32 is formed by depositing an AlGaN film having a thickness of 20 nm. The cap layer 33 is formed by depositing a GaN film having a thickness of 5 nm. As a result, in the channel layer 31, the 2DEG 31a is generated near the interface between the channel layer 31 and the barrier layer 32. In the case of the process of manufacturing a semiconductor crystal substrate, the manufacturing method ends at this step.

Figure 8E:
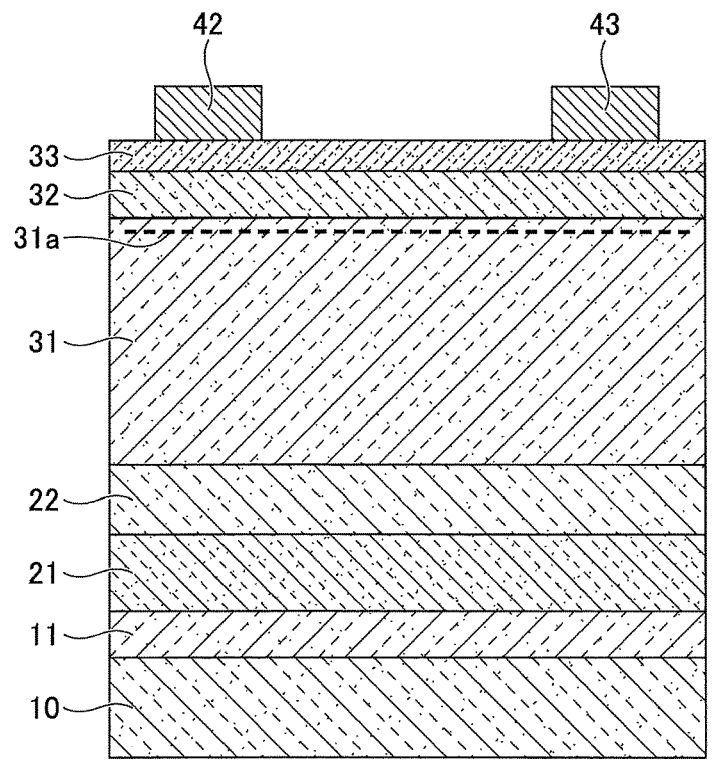

Next, as illustrated in FIG. 8E, the source electrode 42 and the drain electrode 43 are formed on the cap layer 33. Specifically, a photoresist is applied onto the cap layer 33, and is exposed to light by an exposure apparatus and developed to form a resist pattern (not depicted) having openings where the source electrode 42 and the drain electrode 43 are to be formed. Thereafter, a metal film is deposited by vacuum deposition, and the metal film deposited on the resist pattern, together with the resist pattern, is immersed with an organic solvent or the like and removed by a lift-off process. As a result, the metal film remaining on the cap layer 33 forms the source electrode 42 and the drain electrode 43. Thereafter, on an as-needed basis, heat treatment is performed to bring the source electrode 42 and the drain electrode 43 into ohmic contact with the cap layer 33.

Figure 8F:
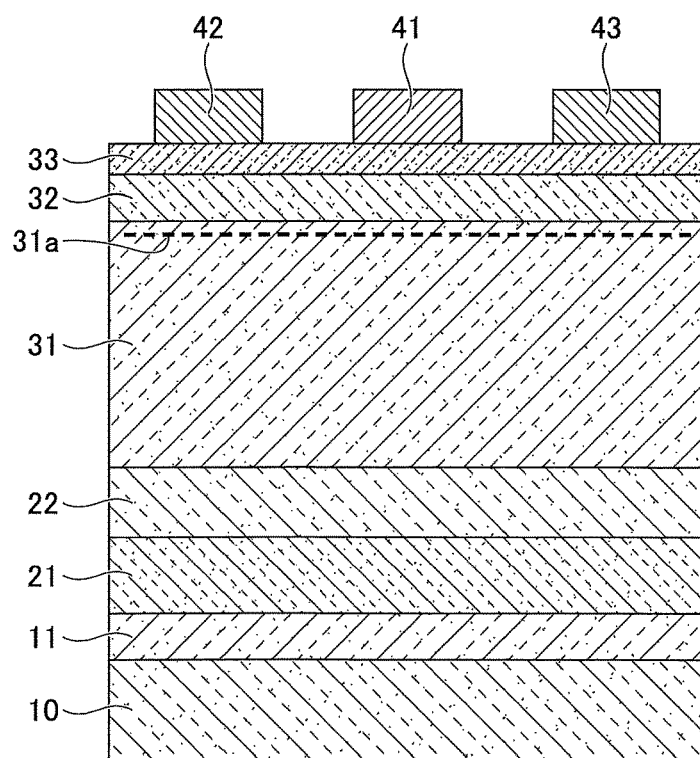

Next, as illustrated in FIG. 8F, the gate electrode 41 is formed on the cap layer 33. Specifically, a photoresist is applied on the cap layer 33, and is exposed to light by an exposure apparatus and developed to form a resist pattern (not depicted) having an opening where the gate electrode 41 is to be formed. Thereafter, a metal film is deposited by vacuum deposition, and the metal film deposited on the resist pattern, together with the resist pattern, is immersed with an organic solvent or the like and removed by a lift-off process. As a result, the metal film remaining on the cap layer 33 forms the gate electrode 41.

By the above-described process, the semiconductor device according to this embodiment can be manufactured.

[b] Second Embodiment

Figure 11:
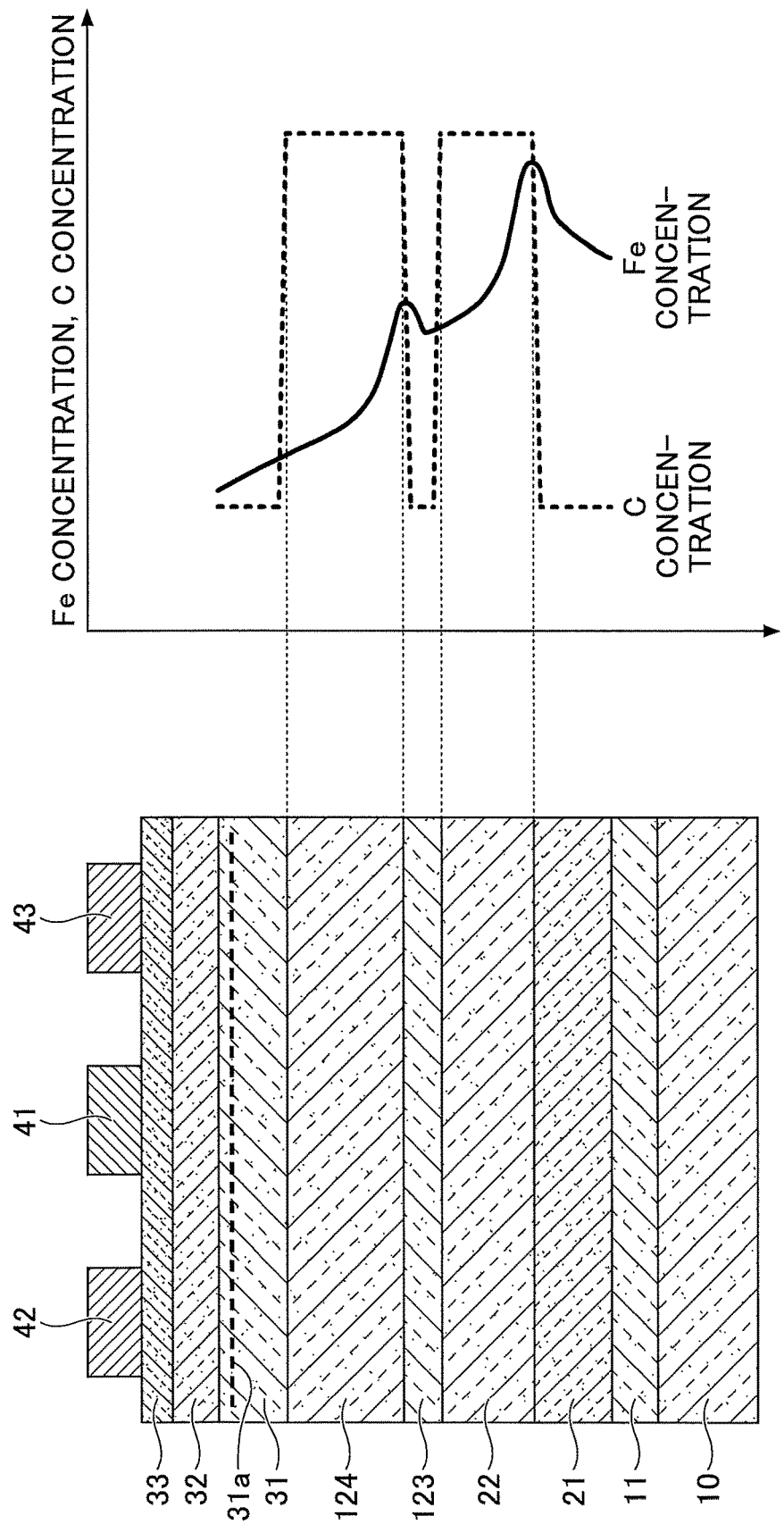
FIG. 11 is a structure diagram of a semiconductor device according to a second embodiment.

Next, a second embodiment is described. As illustrated in FIG. 11, a semiconductor device according to this embodiment includes a third buffer layer 123 formed at a high growth temperature on the second buffer layer 22 and a fourth buffer layer 124 formed at a low growth temperature on the third buffer layer 123. Thus, according to the semiconductor device of this embodiment, nitride semiconductor layers such as the nucleation layer 11, the first buffer layer 21, the second buffer layer 22, the third buffer layer 123, the fourth buffer layer 124, the channel layer 31, the barrier layer 32, and the cap layer 33 are formed in order on the substrate 10. These nitride semiconductor layers are formed by MOVPE.

The third buffer layer 123 is formed by depositing a GaN film that is not doped with an impurity element and has a film thickness of approximately 20 nm on the second buffer layer 22 at a growth temperature of 1200° C. The fourth buffer layer 124 is formed by depositing a GaN film that is not doped with an impurity element and has a film thickness of approximately 100 nm on the third buffer layer 123 at a growth temperature of 900° C. According to this embodiment, the second buffer layer 22 has a film thickness of 100 nm.

Thus, by forming the third buffer layer 123 and the fourth buffer layer 124 between the second buffer layer 22 and the channel layer 31, the diffusion of Fe in the channel layer 31 can be further suppressed as illustrated in the graph of FIG. 11. According to this embodiment, the Fe concentration is higher than the C concentration in the third buffer layer 123, and the C concentration is higher than the Fe concentration in the fourth buffer layer 124.

According to this embodiment, multiple pairs of the third buffer layer 123 and the fourth buffer layer 124 may be formed between the second buffer layer 22 and the channel layer 31. Furthermore, a part of the semiconductor device formed by the third buffer layer 123 and the fourth buffer layer 124 may have a strained-layer superlattice (SLS) structure or a superlattice buffer structure. According to this embodiment, the total film thickness of the GaN layers that are formed at a growth temperature of 900° C. and are not doped with Fe is more than or equal to 200 nm and less than or equal to 300 nm.

According to a method of manufacturing a semiconductor device of this embodiment, after forming layers up to the second buffer layer 22 in the same manner as in the first embodiment, the supply of source gases is stopped, and the temperature of the substrate 10 is increased up to 1200° C. When the temperature of the substrate 10 becomes 1200° C., source gases are supplied to form the third buffer layer 123 of GaN not doped with an impurity element. After the formation of the third buffer layer 123, the supply of source gases is again stopped, and the temperature of the substrate 10 is lowered to 900° C. When the temperature of the substrate 10 becomes 900° C., source gases are supplied to form the fourth buffer layer 124 of GaN not doped with an impurity element. After the formation of the fourth buffer layer 124, the supply of source gases is again stopped, and the temperature of the substrate 10 is increased up to 1200° C. When the temperature of the substrate 10 becomes 1200° C., source gases are supplied to form the channel layer 31, etc., at a growth temperature of 1200° C. in the same manner as in the first embodiment. The subsequent process is the same as in the first embodiment.

In other respects than those described above, the second embodiment may be the same as the first embodiment.

[c] Third Embodiment

Figure 12:
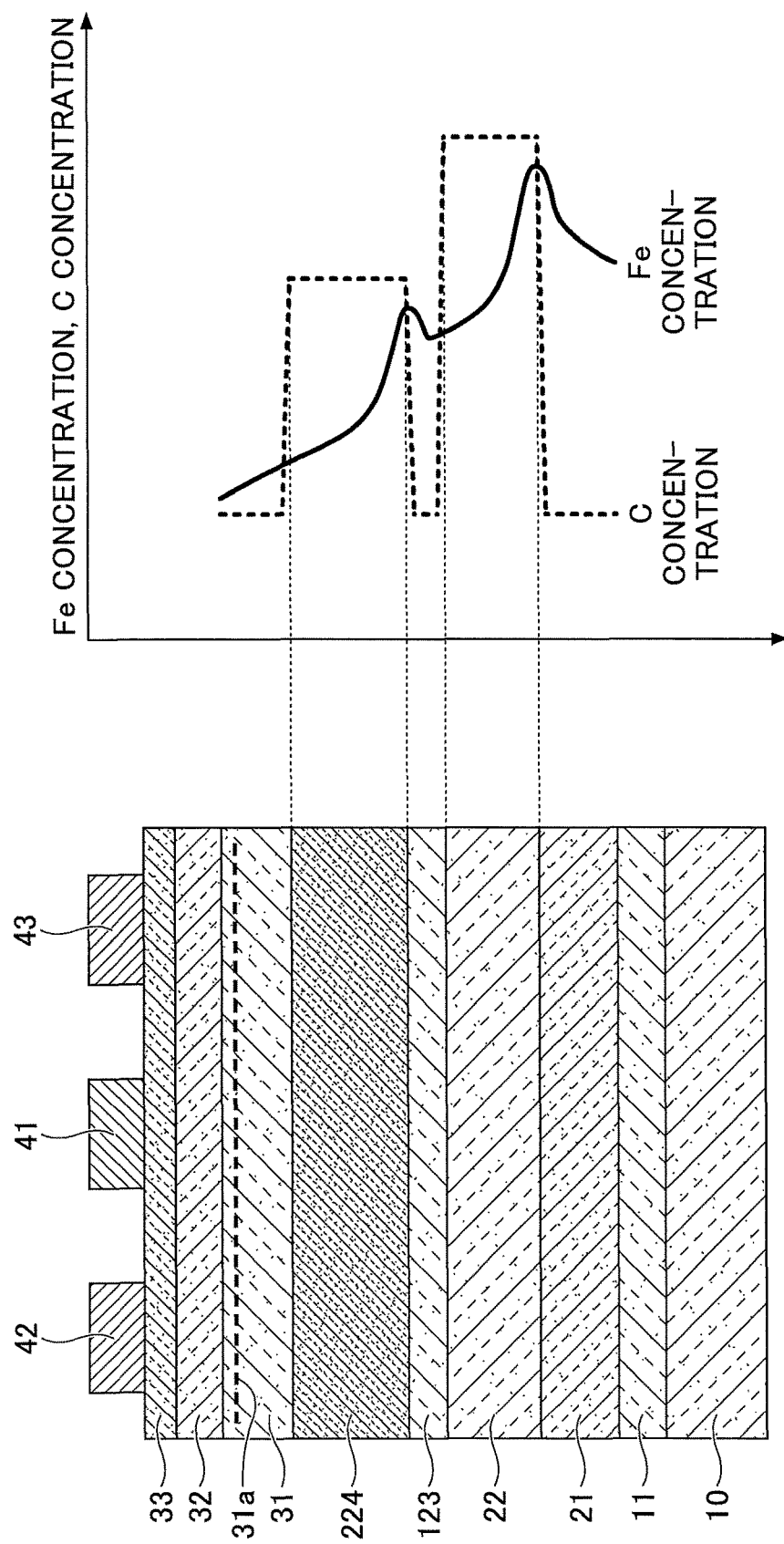
FIG. 12 is a structure diagram of a semiconductor device according to a third embodiment.

Next, a third embodiment is described. As illustrated in FIG. 12, a semiconductor device according to this embodiment includes the third buffer layer 123 formed at a high growth temperature on the second buffer layer 22 and a fourth buffer layer 224 formed at an intermediate growth temperature on the third buffer layer 123. Thus, according to the semiconductor device of this embodiment, nitride semiconductor layers such as the nucleation layer 11, the first buffer layer 21, the second buffer layer 22, the third buffer layer 123, the fourth buffer layer 224, the channel layer 31, the barrier layer 32, and the cap player 33 are formed in order on the substrate 10. These nitride semiconductor layers are formed by MOVPE.

According to this embodiment, the fourth buffer layer 224 is formed by depositing a GaN film that is not doped with an impurity element and has a film thickness of 100 nm on the third buffer layer 123 at a growth temperature of 1040° C. By forming the second buffer layer 22 on the Fe-doped first buffer layer 21, the diffusion of Fe is suppressed to a certain extent. Accordingly, when forming the fourth buffer layer 224, the C concentration can be higher than the Fe concentration as illustrated in the graph of FIG. 12 by decreasing the temperature to 1040° C. instead of decreasing the temperature to 900° C. By forming the fourth buffer layer 224 at a growth temperature of 1040° C., the concentration of C contained in the fourth buffer layer 224 becomes approximately $1 \times 10^{18}$ atoms/cm$^3$. Accordingly, the C concentration of the fourth buffer layer 224 is higher than the C concentration of the first buffer layer 21, but is lower than the C concentration of the second buffer layer 22. According to this embodiment, because the growth temperature of the fourth buffer layer 224 is higher than the growth temperature of the second buffer layer 22, the channel layer 31 of good crystallinity can be obtained. Furthermore, because a time for increasing temperature and a time for decreasing temperature are reduced, it is possible to suppress a decrease in throughput.

Furthermore, according to a method of manufacturing a semiconductor device of this embodiment, after forming the second buffer layer 22 in the same manner as in the first embodiment, the supply of source gases is stopped, and the temperature of the substrate 10 is increased up to 1200° C. When the temperature of the substrate 10 becomes 1200° C., source gases are supplied to form the third buffer layer 123 of GaN not doped with an impurity element. After the formation of the third buffer layer 123, the supply of source gases is again stopped, and the temperature of the substrate 10 is lowered to 1040° C. When the temperature of the substrate 10 becomes 1040° C., source gases are supplied to form the fourth buffer layer 224 of GaN not doped with an impurity element. After the formation of the fourth buffer layer 224, the supply of source gases is again stopped, and the temperature of the substrate 10 is increased up to 1200° C. When the temperature of the substrate 10 becomes 1200° C., source gases are supplied to form the channel layer 31, etc., at a growth temperature of 1200° C. in the same manner as in the first embodiment. The subsequent process is the same as in the first embodiment.

In other respects than those described above, the third embodiment may be the same as the first embodiment.

[d] Fourth Embodiment

Next, a fourth embodiment is described. The fourth embodiment is directed to a semiconductor device, a power supply, and a high-frequency amplifier.

Figure 13:
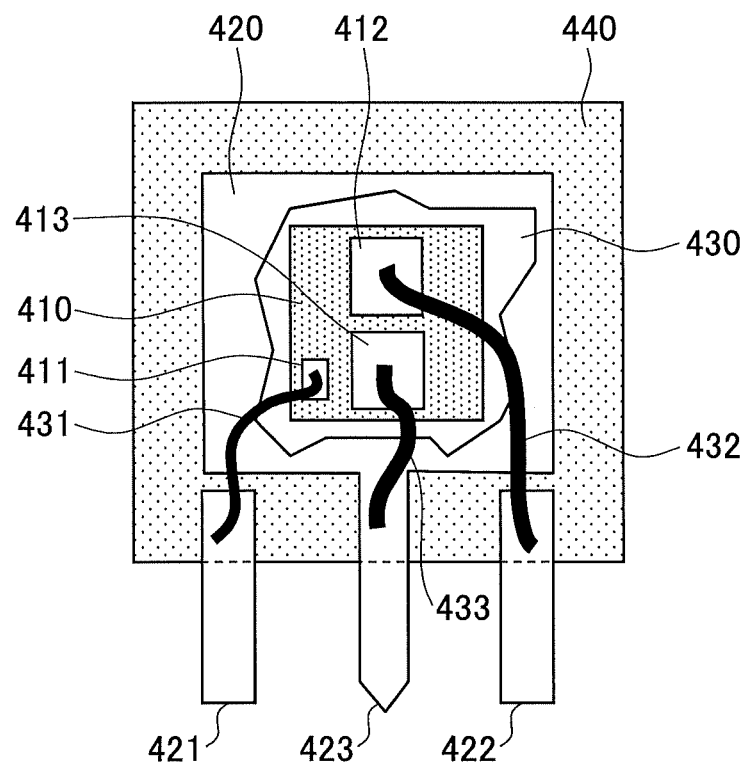
FIG. 13 is a diagram illustrating a discretely packaged semiconductor device according to a fourth embodiment.

A semiconductor device according to this embodiment is a discrete package of one of the semiconductor devices of the first through third embodiments. A semiconductor device thus discretely packaged is described with reference to FIG. 13. FIG. 13 schematically illustrates the inside of the discretely packaged semiconductor device, and the electrode arrangement, etc., are different from those illustrated in the first through third embodiments.

First, the semiconductor device manufactured in the first, second, or third embodiment is cut out by dicing to form a semiconductor chip 410 of a HEMT of a GaN-based semiconductor material. The semiconductor chip 410 is fixed onto a leadframe 420 by a die attach agent 430 such as solder. The semiconductor chip 410 corresponds to the semiconductor devices of the first through third embodiments.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 are formed of a metal material such as Al. Furthermore, according to this embodiment, the gate electrode 411 is a gate electrode pad, and is connected to the gate electrode 41 of the semiconductor device of the first, second, or third embodiment. Furthermore, the source electrode 412 is a source electrode pad, and is connected to the source electrode 42 of the semiconductor device of the first, second, or third embodiment. Furthermore, the drain electrode 413 is a drain electrode pad, and is connected to the drain electrode 43 of the semiconductor device of the first, second, or third embodiment.

Next, resin encapsulation is performed with a mold resin 440 by transfer molding. In this manner, a discretely packaged semiconductor device of a HEMT using a GaN-based semiconductor material can be manufactured.

Next, a power supply and a high-frequency amplifier according to this embodiment, which employ the semiconductor device of one of the first through third embodiments, are described.

Figure 14:
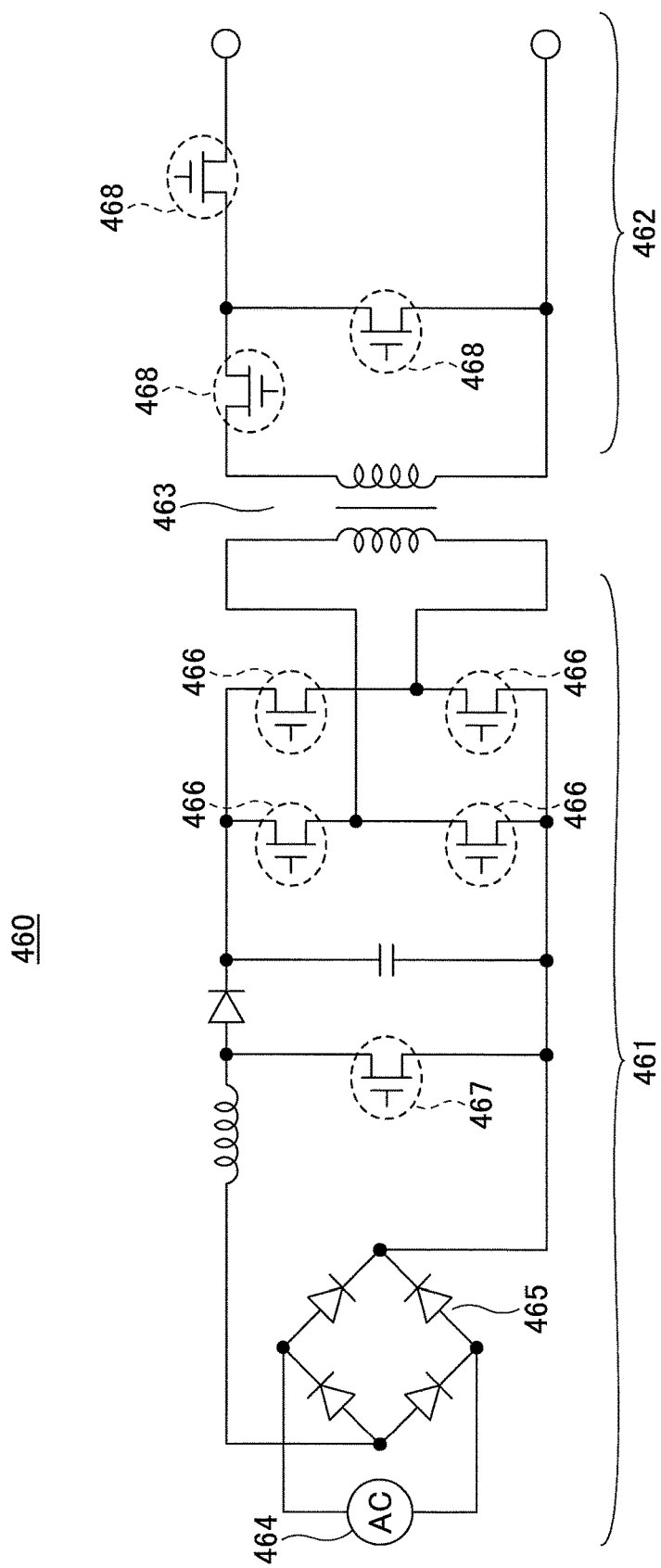
FIG. 14 is a circuit diagram of a power supply according to the fourth embodiment.

First, a power supply according to this embodiment is described with reference to FIG. 14. A power supply 460 according to this embodiment includes a high-voltage primary-side circuit 461, a low-voltage secondary-side circuit 462, and a transformer 463 installed between the primary-side circuit 461 and the secondary-side circuit 462. The primary-side circuit 461 includes an alternating-current (AC) power supply 464, a so-called bridge rectifier circuit 465, multiple (four in the illustration of FIG. 14) switching elements 466, and a switching element 467. The secondary-side circuit 462 includes multiple (three in the illustration of FIG. 14) switching elements 468. In the illustration of FIG. 14, the semiconductor device of any of the first through third embodiments is used for the switching elements 466 and 467 of the primary-side circuit 461. The switching elements 466 and 467 of the primary-side circuit 461 are preferably normally-off semiconductor devices. The switching elements 468 employed in the secondary-side circuit 462 are normal metal-insulator-semiconductor field-effect transistors (MISFETs) formed of silicon.

Figure 15:
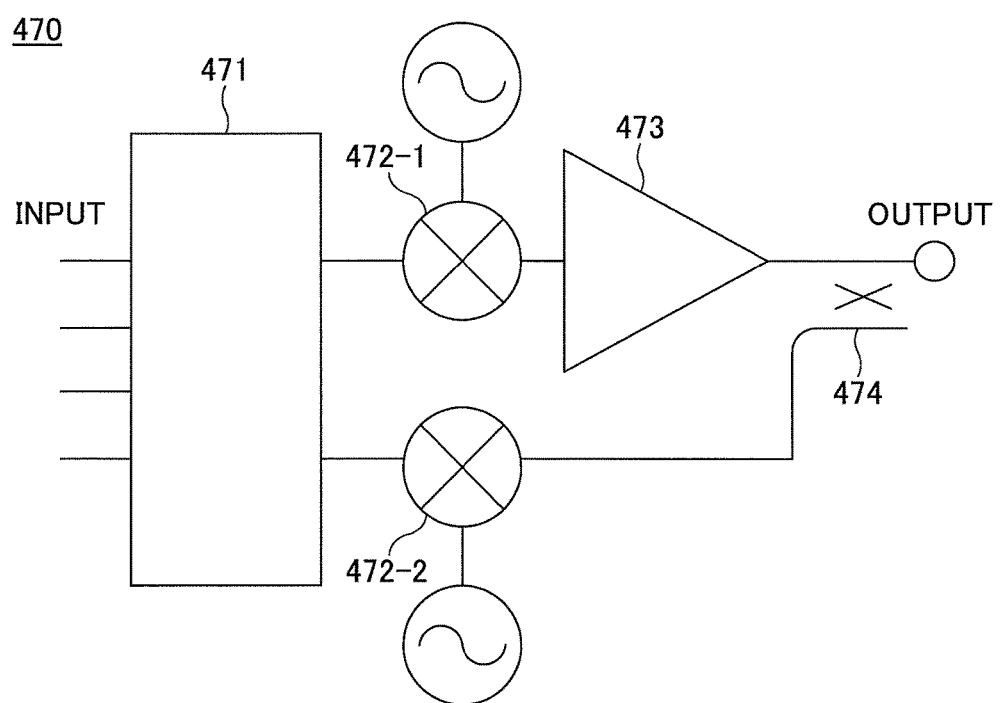
FIG. 15 is a structure diagram of a high-power amplifier according to the fourth embodiment.

Next, a high-frequency amplifier according to this embodiment is described with reference to FIG. 15. A high-frequency amplifier 470 according to this embodiment may be applied to, for example, a power amplifier for a base station of cellular phones. The high-frequency amplifier 470 includes a digital predistortion circuit 471, mixers 472-1 and 472-2, a power amplifier 473, and a directional coupler 474. The digital predistortion circuit 471 compensates a nonlinear distortion of an input signal. The mixer 472-1 mixes the input signal whose nonlinear distortion is compensated and an AC signal. The power amplifier 473 amplifies the input signal mixed with the AC signal. In the illustration of FIG. 15, the power amplifier 473 includes the semiconductor device of one of the first through third embodiments. The directional coupler 474 monitors the input signal and an output signal. According to the circuit illustrated in FIG. 15, for example, by switching a switch, the output signal can be mixed with an AC signal by the mixer 472-2 to be output to the digital predistortion circuit 471.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A semiconductor device, including:
a first buffer layer formed of a nitride semiconductor over a substrate;
a second buffer layer formed of a nitride semiconductor on the first buffer layer;
a first semiconductor layer formed of a nitride semiconductor on or over the second buffer layer;
a second semiconductor layer formed of a nitride semiconductor on the first semiconductor layer; and
a gate electrode, a source electrode, and a drain electrode that are formed over the second semiconductor layer,
wherein an Fe concentration of the first buffer layer is more than or equal to $1\times10^{17}$ atoms/cm$^3$, and
a C concentration of the second buffer layer is higher than an Fe concentration of the second buffer layer.

2. A method of manufacturing a semiconductor crystal substrate, the method including:
forming a first buffer layer of a nitride semiconductor doped with Fe over a substrate;
forming a second buffer layer of a nitride semiconductor on the first buffer layer;
forming a first semiconductor layer of a nitride semiconductor on or over the second buffer layer; and
forming a second semiconductor layer of a nitride semiconductor on the first semiconductor layer,
wherein the first buffer layer, the second buffer layer, the first semiconductor layer, and the second semiconductor layer are formed by metalorganic vapor phase epitaxy, and
a growth temperature of the second buffer layer is lower than a growth temperature of the first buffer layer.

3. A method of manufacturing a semiconductor device, the method including:
forming a first buffer layer of a nitride semiconductor doped with Fe over a substrate;
forming a second buffer layer of a nitride semiconductor on the first buffer layer;
forming a first semiconductor layer of a nitride semiconductor on or over the second buffer layer;
forming a second semiconductor layer of a nitride semiconductor on the first semiconductor layer; and
forming a gate electrode, a source electrode, and a drain electrode over the second semiconductor layer,
wherein the first buffer layer, the second buffer layer, the first semiconductor layer, and the second semiconductor layer are formed by metalorganic vapor phase epitaxy, and
a growth temperature of the second buffer layer is lower than a growth temperature of the first buffer layer.

What is claimed is:

1. A semiconductor crystal substrate, comprising:
a first buffer layer formed of a nitride semiconductor over a substrate;
a second buffer layer formed of a nitride semiconductor on the first buffer layer;
a first semiconductor layer formed of a nitride semiconductor on or over the second buffer layer; and
a second semiconductor layer formed of a nitride semiconductor on the first semiconductor layer,
wherein an iron (Fe) concentration of the first buffer layer is higher than a carbon (C) concentration of the first buffer layer,
a C concentration of the second buffer layer is higher than an Fe concentration of the second buffer layer throughout the second buffer layer in a thickness direction of the second buffer layer, and
the Fe concentrations of the first and second buffer layers peak at an interface between the first and second buffer layers.

2. The semiconductor crystal substrate as claimed in claim 1, wherein the C concentration of the second buffer layer is higher than the C concentration of the first buffer layer.

3. The semiconductor crystal substrate as claimed in claim 1, wherein
the C concentration of the first buffer layer is less than $1\times10^{17}$ atoms/cm$^3$, and
the C concentration of the second buffer layer is more than or equal to $1\times10^{17}$ atoms/cm$^3$.

4. The semiconductor crystal substrate as claimed in claim 1, wherein the first buffer layer and the second buffer layer are in contact.

5. The semiconductor crystal substrate as claimed in claim 1, further comprising:
a third buffer layer formed of a nitride semiconductor on the second buffer layer; and
a fourth buffer layer formed of a nitride semiconductor on the third buffer layer,
wherein the first semiconductor layer is formed on the fourth buffer layer,
an Fe concentration of the third buffer layer is higher than a C concentration of the third buffer layer, and
a C concentration of the fourth buffer layer is higher than an Fe concentration of the fourth buffer layer.

6. The semiconductor crystal substrate as claimed in claim 5, wherein the C concentration of the fourth buffer layer is lower than the C concentration of the second buffer layer, and is higher than the C concentration of the first buffer layer.

7. The semiconductor crystal substrate as claimed in claim 1, wherein the first buffer layer is a p-type.

8. The semiconductor crystal substrate as claimed in claim 1, wherein
the first buffer layer is formed of a material including GaN, and
the second buffer layer is formed of a material including GaN.

9. A semiconductor crystal substrate, comprising:
a first buffer layer formed of a nitride semiconductor over a substrate;
a second buffer layer formed of a nitride semiconductor on the first buffer layer;

a first semiconductor layer formed of a nitride semiconductor on or over the second buffer layer; and a second semiconductor layer formed of a nitride semiconductor on the first semiconductor layer, wherein an iron (Fe) concentration of the first buffer layer is more than or equal to $1 \times 10^{17}$ atoms/cm$^3$, a carbon (C) concentration of the second buffer layer is higher than an Fe concentration of the second buffer layer throughout the second buffer layer in a thickness direction of the second buffer layer, and the Fe concentrations of the first and second buffer layers peak at an interface between the first and second buffer layers.

10. A semiconductor device, comprising:

a first buffer layer formed of a nitride semiconductor over a substrate;

a second buffer layer formed of a nitride semiconductor on the first buffer layer;

a first semiconductor layer formed of a nitride semiconductor on or over the second buffer layer;

a second semiconductor layer formed of a nitride semiconductor on the first semiconductor layer; and a gate electrode, a source electrode, and a drain electrode that are formed over the second semiconductor layer, wherein an iron (Fe) concentration of the first buffer layer is higher than a carbon (C) concentration of the first buffer layer, a C concentration of the second buffer layer is higher than an Fe concentration of the second buffer layer throughout the second buffer layer in a thickness direction of the second buffer layer, and the Fe concentrations of the first and second buffer layers peak at an interface between the first and second buffer layers.

11. The semiconductor device as claimed in claim 10, wherein the C concentration of the second buffer layer is higher than the C concentration of the first buffer layer.

12. The semiconductor device as claimed in claim 10, wherein the C concentration of the first buffer layer is less than $1 \times 10^{17}$ atoms/cm$^3$, and the C concentration of the second buffer layer is more than or equal to $1 \times 10^{17}$ atoms/cm$^3$.

13. The semiconductor device as claimed in claim 10, wherein the first buffer layer and the second buffer layer are in contact.

14. The semiconductor device as claimed in claim 10, further comprising:

a third buffer layer formed of a nitride semiconductor on the second buffer layer; and a fourth buffer layer formed of a nitride semiconductor on the third buffer layer, wherein the first semiconductor layer is formed on the fourth buffer layer, an Fe concentration of the third buffer layer is higher than a C concentration of the third buffer layer, and a C concentration of the fourth buffer layer is higher than an Fe concentration of the fourth buffer layer.

15. The semiconductor device as claimed in claim 14, wherein the C concentration of the fourth buffer layer is lower than the C concentration of the second buffer layer, and is higher than the C concentration of the first buffer layer.

16. The semiconductor device as claimed in claim 10, wherein the first buffer layer is a p-type.

17. The semiconductor device as claimed in claim 10, wherein the first buffer layer is formed of a material including GaN, and the second buffer layer is formed of a material including GaN.

18. A power supply, comprising:

the semiconductor device as set forth in claim 10.

19. An amplifier, comprising:

the semiconductor device as set forth in claim 10.

* * * * *